United States Patent [19]

Koontz

[11] Patent Number: 5,163,181
[45] Date of Patent: Nov. 10, 1992

[54] MULTIPLE RF SIGNAL AMPLIFICATION METHOD AND APPARATUS

[75] Inventor: Floyd A. Koontz, Holcomb, N.Y.

[73] Assignee: Harris Corporation, Melbourne, Fla.

[21] Appl. No.: 260,722

[22] Filed: Oct. 21, 1988

[51] Int. Cl.$^5$ .......................... H04B 1/02; H04B 1/04
[52] U.S. Cl. .................. 455/103; 455/114; 370/69.1; 336/83; 333/127
[58] Field of Search ............... 455/103, 101, 102, 104, 455/114; 333/12, 243; 370/69.1; 336/83; 375/40; 307/241, 243; 330/149, 124 R, 295

[56] References Cited

U.S. PATENT DOCUMENTS

| | | | |
|---|---|---|---|
| 2,298,409 | 10/1942 | Peterson | 370/69.1 |
| 2,640,193 | 5/1953 | Carter et al. | 370/69.1 |
| 3,310,742 | 3/1967 | Adams | 375/40 |
| 3,342,941 | 9/1967 | Kondo | 455/103 |
| 3,717,833 | 2/1973 | Kubota et al. | 336/69 |
| 3,835,430 | 9/1974 | Kocsis | 336/83 |
| 4,238,855 | 12/1980 | Zborowski | 455/103 |
| 4,262,355 | 4/1981 | Schiff | 370/69.1 |
| 4,477,781 | 10/1984 | Reuss, Jr. | 330/124 R |
| 4,543,554 | 9/1985 | Muellenheim et al. | 336/83 |
| 4,618,831 | 10/1986 | Egami et al. | 330/124 R |
| 4,647,868 | 3/1987 | Mueller | 333/124 |
| 4,680,559 | 7/1987 | Swanson | 333/100 |
| 4,769,900 | 9/1988 | Morinaga et al. | 336/83 |
| 4,774,481 | 9/1988 | Edwards et al. | 333/127 |

FOREIGN PATENT DOCUMENTS

| | | | |
|---|---|---|---|
| 2452252 | 6/1976 | Fed. Rep. of Germany | 336/83 |
| 187903 | 3/1988 | Japan | 330/295 |

OTHER PUBLICATIONS

"The UET Multitube Transmitter", Standing, Mar. 25, 1987 pp. 355-366, Comsat Tech. Rev., vol. 5, No. 2 (Fall 1975).

Primary Examiner—Reinhard J. Eisenzopf
Assistant Examiner—Lisa Charouel

[57] ABSTRACT

A wideband communication system and method for wideband communication that provide plural signals to a single transmitting antenna. Each signal is independently modulated and amplified, and then combined with other signals for transmission on the antenna. The independent amplification, that is, amplification without prior combination with other signals, reduces the number of intermodulation products (IP), thereby reducing the need for complicated IP cancellation techniques. A distribution circuit provides that when the number of signals exceeds the number of amplifiers, two signals may be combined before amplification. The amplified signals may be combined before transmission in combiners that include transformers that reduce IP caused by RF interference. The transformers are formed by enclosing the transmission line within a cavity in a block of ferrite material.

15 Claims, 10 Drawing Sheets

MULTIPLE RF SIGNAL AMPLIFICATION METHOD AND APPARATUS

BACKGROUND OF THE INVENTION

The present invention relates generally to a method and apparatus for combining and amplifying radio frequency ("RF") signals. In particular, the present invention relates to an RF communication system in which plural independent signals may be combined, amplified, and radiated through shared resources with reduced distortion.

In many RF communication systems, it is desirable to share the resources of portions of the transmission systems among various communication users, according to their needs to utilize the RF communication channels. Frequently, it is desirable that a single amplifier system be used to amplify plural signals, the input signals not being connected with or related to each other in any way, and being fed to one or more transmitting aerials. The plural independent RF signals fed to a single amplifier system at the same time are simultaneously amplified for transmission and fed to an antenna distribution network. Such RF signals may include two or more information modulated carrier wave signals based upon carrier waves of differing frequencies (the "fundamental frequencies"). Such systems are disclosed in the Myer U.S. Pat. No. 4,580,105 issued Apr. 1, 1986; Engelbrecht U.S. Pat. No. 3,383,618 issued May 14, 1968; Olver U.S. Pat. No. 4,560,945 issued Dec. 24, 1985; and Gerard U.S. Pat. No. 4,423,386 issued Dec. 27, 1983.

It is well known that the amplification of RF signals usually results in the generation of harmonics of the input signal. The harmonics are spurious signals or frequencies which are whole-number multiples of the basic signal frequency, i.e., twice, three times, four times, et cetera. For a single basic frequency, these harmonics are reduced in power level to the point at which they can often be ignored. However, the amplification of plural combined signals of quite different basic or fundamental frequencies inevitably gives rise not only to the harmonics of the fundamental frequencies, but also to the formation of what are known as "intermodulation products", i.e., extra spurious output signals related to combinations of the basic input signals and their harmonics. For example, where a signal of frequency F1 and a signal of frequency F2 are simultaneously amplified, there will be generated the harmonics $2F1$, $3F1$, $4F1$, $5F1$ ... and $2F2$, $3F2$, $4F2$, $5F2$ ... and also intermodulation products of the type $F1\pm F2$, $2F1\pm F2$, $3F1\pm F2$ .... Frequently, so many of these intermodulation product signals are produced that they cause unacceptable interference with other signals over a very wide portion of the radio spectrum being utilized. The interference problem grows tremendously as the number of independent input signals increases because the number of combinations increases very rapidly as the number of signals increase. The number of possible significant intermodulation combinations for just four fundamental frequencies can exceed 12,000 and for six basic frequencies can be over one-quarter of a million.

The numerous intermodulation products mixed along with the desired signals are transmitted by the antenna and can desensitize RF receivers which are located nearby.

Previously, to prevent or reduce the radiation of intermodulation products, narrowband filters were used with either or both of the transmitting equipment and the receiving equipment. Such filters can be quite useful in narrowband communication systems in which the frequencies of the transmitters and receivers are well known and unvarying and in which amplifiers can be dedicated to the amplification of single fundamental frequencies. However, modern wideband architecture allows multiple exciters to be fed to a common antenna with no tunable filters between the power amplifier and the antennas. Such an architecture is particularly useful for frequency-hopping RF systems in which narrowband filtering is difficult to perform because of the settling time for filters and the need for frequency-hopping systems to frequently change the carrier or fundamental frequency of the transmitted signal.

To reduce the amount of intermodulation products which were transmitted, some prior art systems, such as those disclosed in the Olver and Myer patents, used adaptive feed-forward cancellation in which a portion of the input signal, prior to being amplified, is compared to the signal after combination and amplification to identify and cancel the intermodulation distortion products. Such cancellation techniques generally improve the intermodulation distortion problems; however, such techniques generally do not eliminate all intermodulation distortion, consume considerable power, involve the addition of complex circuitry, and, because of the nonlinearities in the feed-forward cancellation apparatus, introduce new sources of error to the RF output signal.

Within the amplifying and combining circuits of prior art and the present invention, it is frequently necessary to use wideband transformers. Often, such transformers spray a considerable amount of RF interference ("RFI") signals into other elements of the amplifier and communication system because of the buildup and release of electromagnetic fields surrounding the transformers. The sprayed RFI signals may be coupled into other components of the amplifier system and thereby distort the desired output signal. Accordingly, it is often a concern of RF system designers to utilize transformers which reduce the amount of RFI generated and available for unwanted coupling.

Many transformers of the prior art comprise a magnetic ferrite surrounded by one or more turns of a transmission line. Where the transmission line and the ferrite are adjacent, the transformer is efficient; however, where the transmission line is not adjacent the ferrite core (e.g., around the ends), the transformer is often ineffective and standing waves may be generated.

Accordingly, it is an object of the present invention to provide a novel method and apparatus for combining and amplifying RF signals with fewer interfering intermodulation distortion products.

It is another object of the present invention to provide a novel transformer apparatus which reduces the inefficiencies of known prior art transformers and which reduces the amount of RF interference sprayed for potential interference with other components of the amplifier and combiner system.

It is a further object of the present invention to provide a novel method and apparatus for amplifying plural RF signals with a relatively higher power efficiency when compared to prior art wideband amplifiers.

It is yet another object of the present invention to provide a novel method and apparatus to reduce the amount of intermodulation product distortion which is generated and transmitted by inductive circuit elements within the amplifier system.

It is still another object of the present invention to provide a novel method and apparatus to reduce the voltage standing wave ratio at the output of an RF amplifier which is amplifying a combination of fundamental frequencies.

It is still a further object of the present invention to provide an RF signal amplification method and apparatus for use in applications where transmitting and receiving antennas must be in close proximity.

These and many other objects of the present invention will become apparent upon reading of the following detailed description of the invention when considered in conjunction with the drawings.

THE DRAWINGS

DETAILED DESCRIPTION OF PREFERRED EMBODIMENTS

Figure 1:
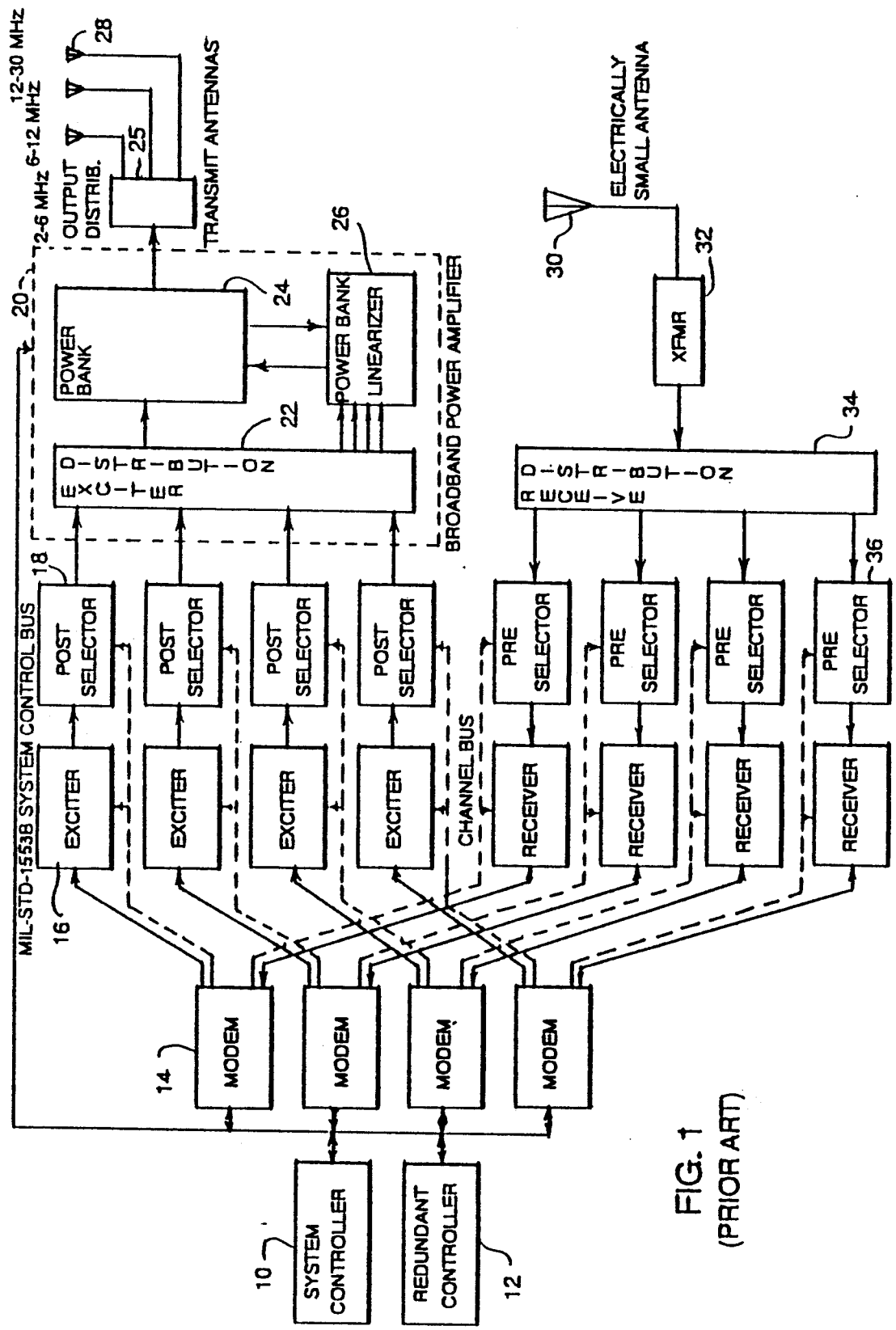
FIG. 1 is a schematic block diagram of a broadband multichannel high frequency communication system of the prior art.

With reference to FIG. 1, there is shown a prior art broadband multichannel RF communication system. The communication system of FIG. 1 is described more fully in IEEE Conference Publication 245, "HF Communication Systems and Techniques", 26–28 Feb. 1985 by David H. Towsend of the U.S. Naval Research Laboratories, Washington, D.C. Note that in the system of FIG. 1 the elements are divided generally into a transmission section, schematically depicted at the top of the figure, and a receiving section, schematically depicted at the bottom of the FIG. 1. Such a system may be found particularly useful in a naval vessel, where multiple simultaneous communications are needed along with the ability to monitor and receive signals on other frequencies but an insignificant amount of spatial distance can be obtained between the transmit antennas and the receive antenna.

With continued reference to FIG. 1, a system controller 10 and redundant controller 12 control the transmission of information signals to be transmitted to plural modems 14. The signals to be transmitted are fed by the modems 14 to one or more of the plural exciters 16, which generally modulate a predetermined carrier or fundamental signal by the information signal received from the modem 14. Because of the modulation process of the exciter 16, usually integer harmonics of the modulated signal may be generated at reduced power levels and accompany the modulated signal. A post selector 18 may be used to narrowly filter the output signal of the exciter and provide the signal to a broadband power amplifier 20, which may simultaneously receive the signals from plural post selectors 18. Within the broadband power amplifier 20, the signals from the post selectors 18 are received by an exciter distribution system 22, which combines the signals from the post selectors 18 and provides the combined signals to a power bank 24 and to a power bank linearizer 26. The power bank 24 includes plural amplifiers, each of which receives a portion of the combined signal, amplifies the signal, and the amplified signals are combined and provided to an output distribution system 26. The output distribution system 26 divides the combined signal by means such as filters or multiplexing and provides the divided signals to appropriate transmitting antennas 28.

The power bank linearizer 26 provides cancellation signals which estimate the location and power of the intermodulation products and then attempts to cancel those products from the amplified signals in the power bank 24. The linearizer 26 may use the fundamentals sensed in the exciter distribution system to effect cancellation of the amplified signal. Sometimes the power bank linearizer 26 consumes as much power in its operation as the power bank amplifiers 24. A more complete description of the linearizing or equalizing process may be found in IEEE Transactions on Communications, Vol. COM-28, No. 9, September 1980, "A New Wide-Band System Architecture for Mobile High Frequency Communication Networks".

With continued reference to FIG. 1, the signal transmitted from the transmit antennas 28 is also received in the receive antenna 30. Typically, the receive antenna 30 is an electrically small antenna to avoid receiving too much energy from the transmit antennas. However, such a small antenna will also necessarily limit the amount of signal which is received from desired sources. The receive signal is forwarded from the antenna 30 to a transformer 32 and receive distribution system 34, which provides the receive signal to plural preselectors 36, which have been tuned to the desired frequencies of the receiving system. The receive distribution system 34 and the preselectors 36 may also utilize information concerning the frequencies being transmitted by the transmit antennas to predict and cancel the intermodulation products.

Figure 2:
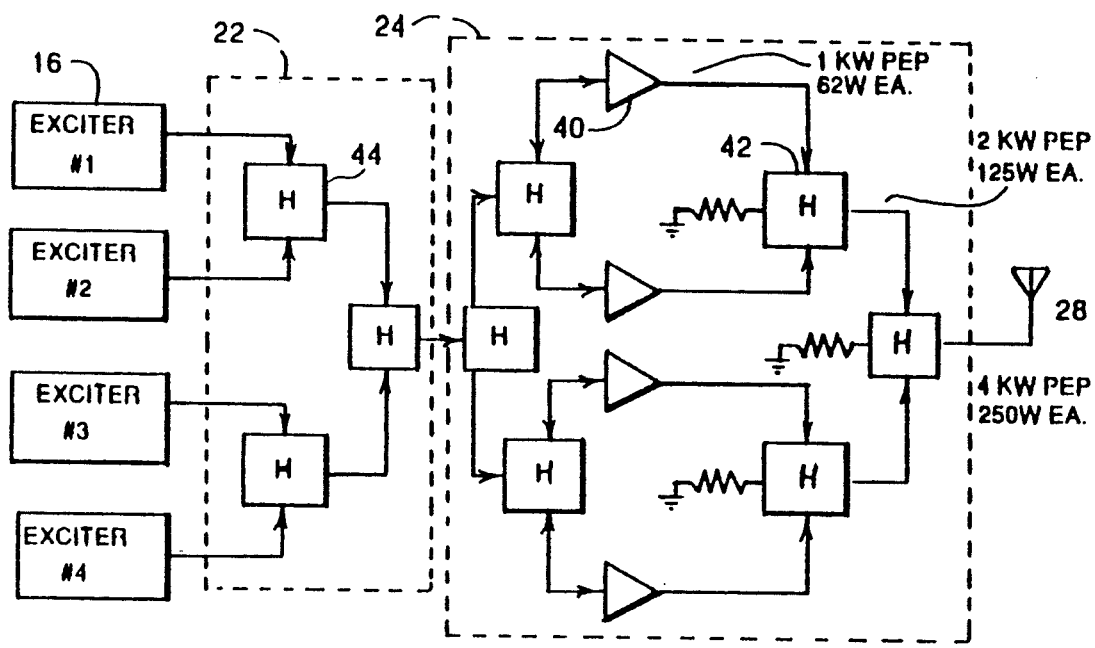
FIG. 2 is a schematic block diagram illustrating the exciter distribution and amplification of the prior art communication system of FIG. 1.

With reference to FIG. 2, in which like numerals have been utilized for like elements as those enumerated in FIG. 1, in the exciter distribution system 22 of the prior art, the exciters 16 are sequentially combined by hybrid combiners 44 to generate a combined wideband signal having each of the narrowband exciter signals thereon. The combined signal is then split by additional hybrid circuits to provide the combined wideband signals to each of the wideband amplifiers 40 of the power bank 24.

In the system of FIG. 2, each of the wideband amplifiers 40 receives one-fourth the combined signal and then amplifies the signal to produce a one-kilowatt peak envelope power, 62-watt-per-signal amplified signal. The signals output from each of the wideband power amplifiers 40 are combined by a series of hybrids 42 to produce a fully amplified signal at the antenna 28, which could also be an output distribution system to feed plural antennas from the combined amplified signal.

In the communication system of FIG. 2, because each of the fundamental signals, i.e., each of the signals provided by the exciters 16, are first combined and then amplified, the system creates numerous intermodulation distortion products which have to be removed by such techniques as the power bank linearizer 26 of FIG. 1 prior to transmission.

Figure 3:
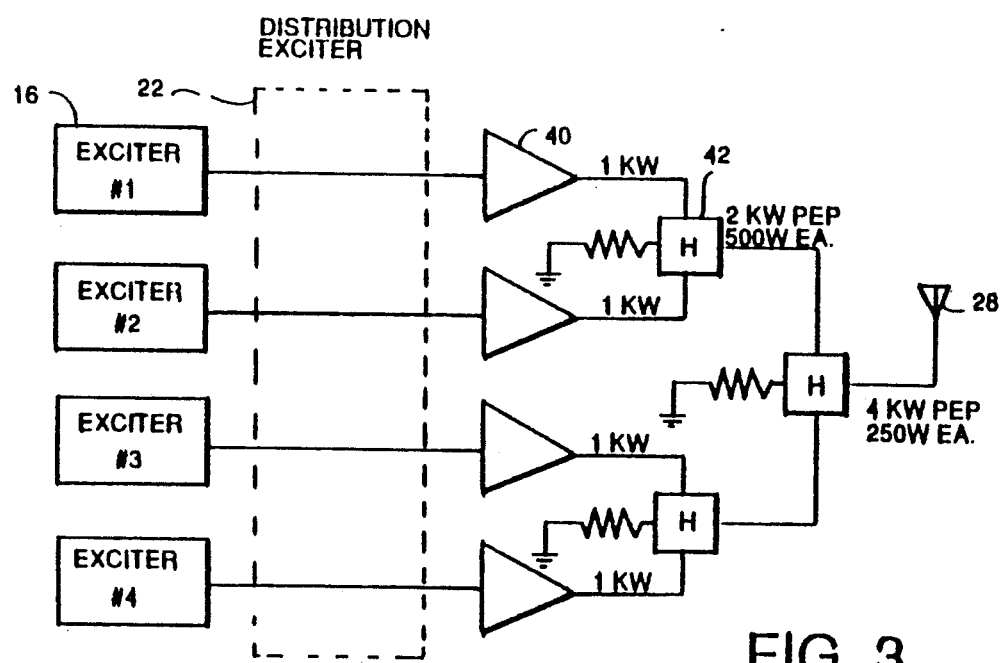
FIG. 3 is a schematic block diagram of an RF communication system in accordance with the present invention.

With reference to FIG. 3, in a system according to the present invention, each of the exciters 16 may directly feed a wideband amplifier 40. The amplified signals appearing at the output of the wideband amplifiers 40 may be combined using hybrid combiners 42 to provide a combined signal to the antenna 28 or suitable output distribution means.

In the communication system of FIG. 3, the fundamental frequencies provided by each of the exciters 16 are not combined until after the signals have been amplified by the wideband amplifiers 40. In this way, the generation of wideband intermodulation distortion products caused by the amplification of two independent fundamental signals is avoided. Of course, narrowband intermodulation products, e.g., harmonics of the exciter and its modulation, will still be present; however, these harmonics will generally be at significantly lower power so as to not cause considerable system degradation.

The communication system shown in FIG. 3 can combine up to four independent fundamental frequencies for output distribution without the generation of the more than 12,000 significant intermodulation distortion products caused by the prior art systems. If additional frequencies are desired to be combined for distribution, additional exciters can be added to the communication system to separately feed additional wideband amplifiers which are in turn combined with the other wideband amplifiers to provide a combined output signal at the transmit antenna 28. However, the additional amplification and combining units required may complicate the system such that, rather than adding amplification units, two of the exciters may be combined on a single amplifier using a hybrid combiner as in the prior art. While such a combination of signals would generate the intermodulation distortion products just as in the prior art, the number of intermodulation products would number in the hundreds rather than in the hundreds of thousands which would be generated if all five fundamental frequencies were combined before amplification.

Figure 4:
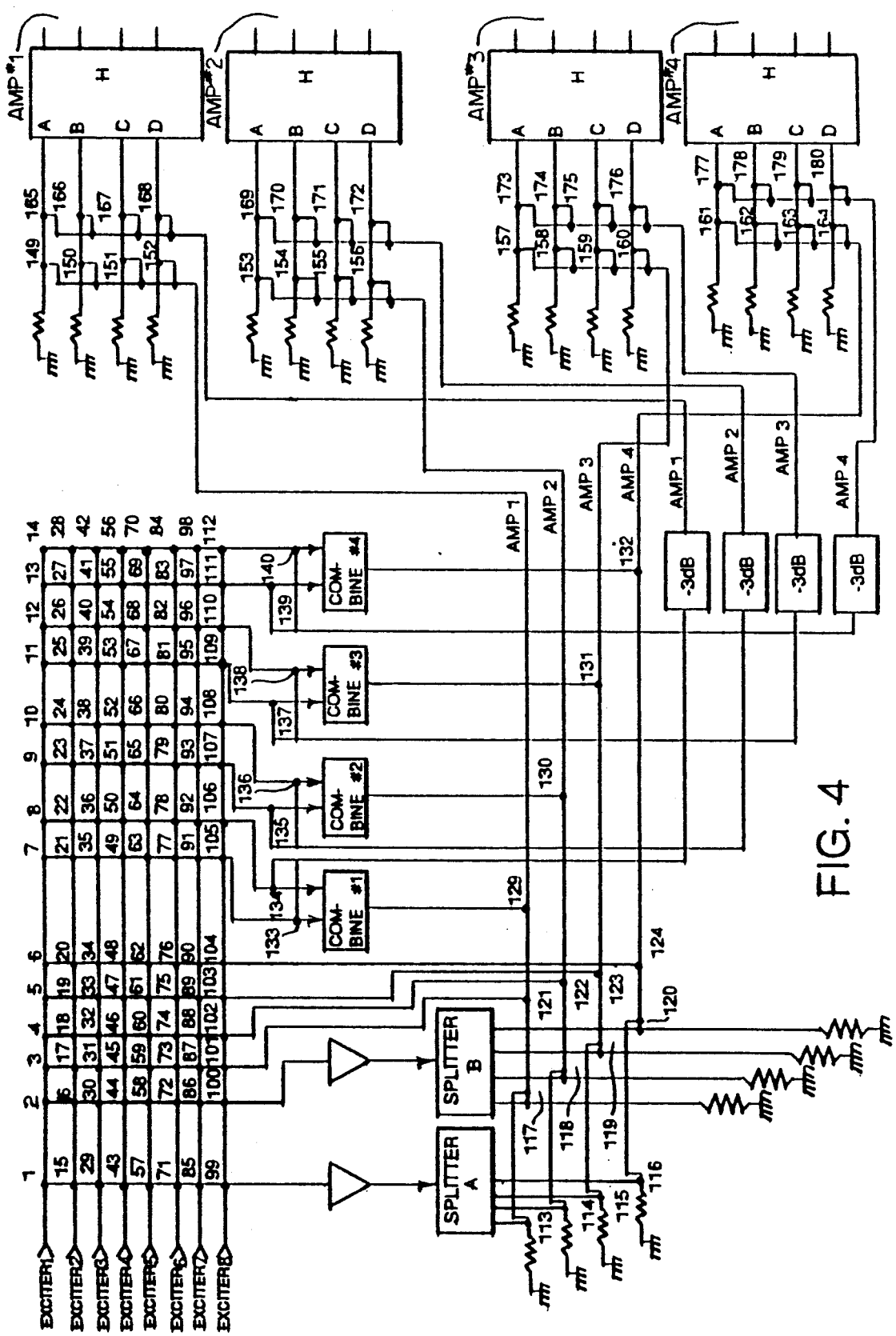
FIG. 4 is a schematic block diagram of an input signal distribution unit which may be utilized with the communication system of FIG. 3.

With reference to FIG. 4, an input signal distribution unit used in the present invention may be constructed using RF relays, pin diodes, splitters, and combiners to provide switching between the exciters and amplifiers of a power bank amplifier system. The input signal distribution unit of FIG. 4 includes a switch matrix (node numbers 1-180 of FIG. 4) from which any of the exciter signals may be provided to either Splitter A, Splitter B, Combiner No. 1, Combiner No. 2, Combiner No. 3, or Combiner No. 4, or directly to any one of the four H (hybrid) matrices. The splitters may be conventional four-way hybrid splitters, and the combiners may be conventional in-phase hybrid combiners. The H matrices may be conventional port steering matrices. By appropriate and standard control mechanisms, each of the desired switches of the switch matrix may be selected to provide any of the exciter signals in any given combination to the amplifiers which are connected to the H matrices of the input signal distribution unit of FIG. 4. Signals occurring at any of the exciters 1 through 8 may be provided individually or in any given combination. Thus, the signal appearing at hybrid No. 1 may be Exciter 1, Exciter 1 plus Exciter 2, Exciter 1 plus Exciter 3, Exciter 1 plus Exciter 2 plus Exciter 3, Exciter 1 plus Exciter 2 plus Exciter 4, Exciter 2 alone .... In this manner, any of the exciters may be provided alone or in combination to any of the amplifiers and eventually to any of the antennas. Note that the input signal distribution unit permits the signals to be sent to the amplifiers without being combined prior to amplification if four or fewer exciters are being selected. If more than four exciters are being selected, the signals may be combined in the manner which provides the fewest intermodulation products being produced, i.e., by limiting the number of combined inputs to any one amplifier.

Note that all switching, splitting, and combining in the input signal distribution unit of FIG. 4 is done on low power, i.e., unamplified, signals. Accordingly, signal distribution, in general, can be accomplished with relatively less expensive, low power electronic components.

The reduction in the number of intermodulation distortion products in the RF communication system of the present invention results in an increase of efficiency from approximately 7.5 percent for prior art devices to between 15 and 25 percent in the present invention. In other words, a low distortion amplifier will usually obey the third order intercept law. An amplifier operating at 15-percent efficiency will operate at 30-percent efficiency if the intermodulation distortion is reduced by 6 db. Similarly, an amplifier operating at 7.5-percent efficiency would improve to over 30-percent efficiency with a lowering of the intermodulation distortion of 12 db.

Use of the present invention results in reduced linearity requirements in the amplifier driver and the other low level circuits. In a conventional power bank design, any intermodulation distortion or harmonics generated in exciter combining, low level amplifiers, ferrite transformers, or other circuits prior to the final amplifier stage, pass through as if they were the desired signals and are amplified. In the architecture of the present invention, only one narrowband signal is present, which greatly simplifies the design. Additionally, since only one signal is being amplified, the ferrite transformers in the low level and intermediate level stages can be designed in a conventional way without stringent intermodulation distortion concerns. Even in the output combiner, only the ferrite transformers which carry two or more RF signals will generate intermodulation products.

Figure 5:
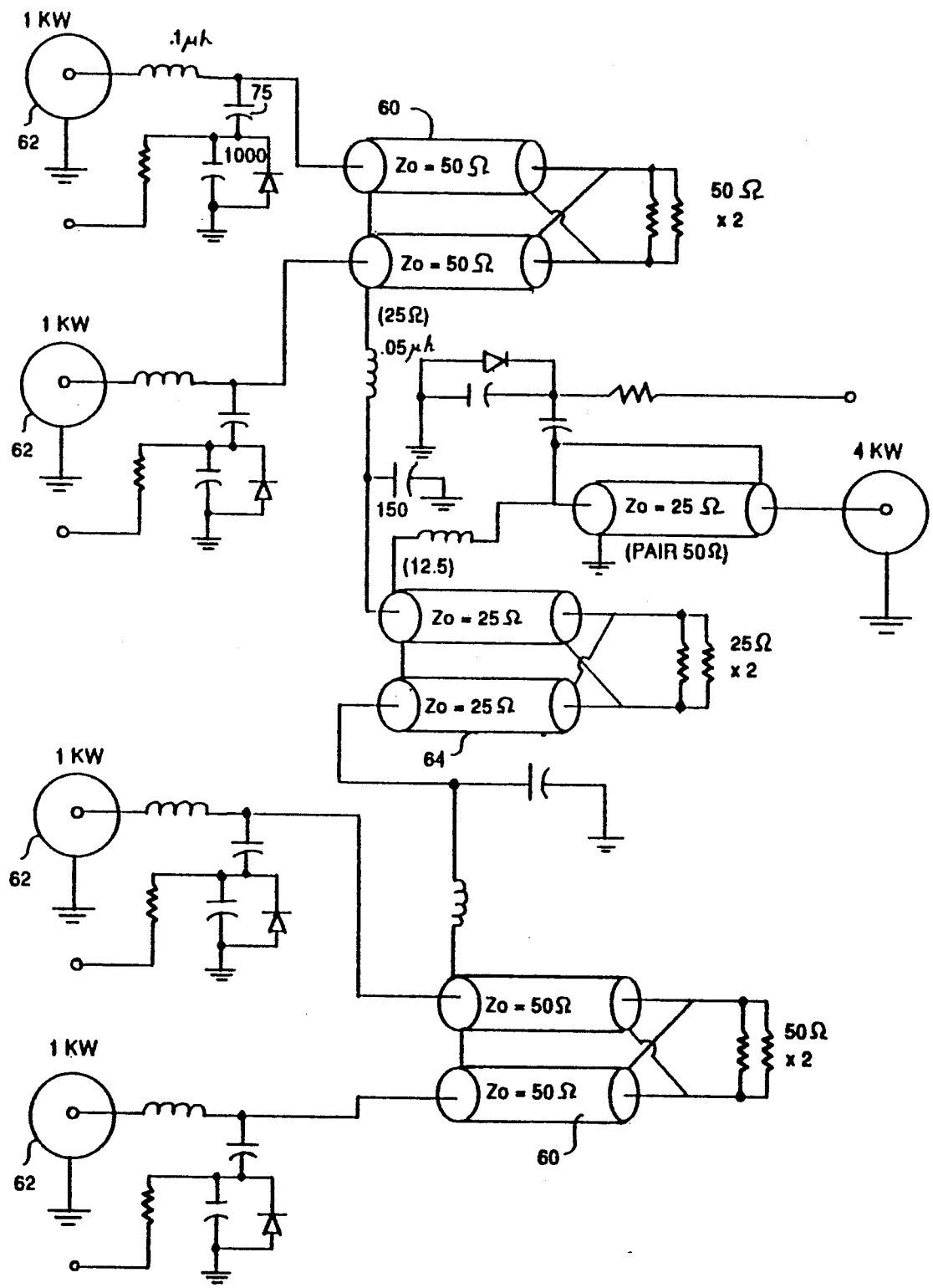
FIG. 5 is a signal combiner which may be utilized with the communication system of FIG. 3.

With reference to FIG. 5, a combiner for use with an apparatus of the present invention includes two hybrid combiner transformers 60, each of which combines two of the four input signals appearing at the input ports 62. The output signals from each of the hybrid combiner transformers 60 are similarly combined by a third hybrid combiner transformer 64. The output signal of the third hybrid combiner transformer is applied to a 4-to-1 impedance step-up transformer to return the characteristic impedance on the output side of the combiner to the same as on the input side.

Figure 6:
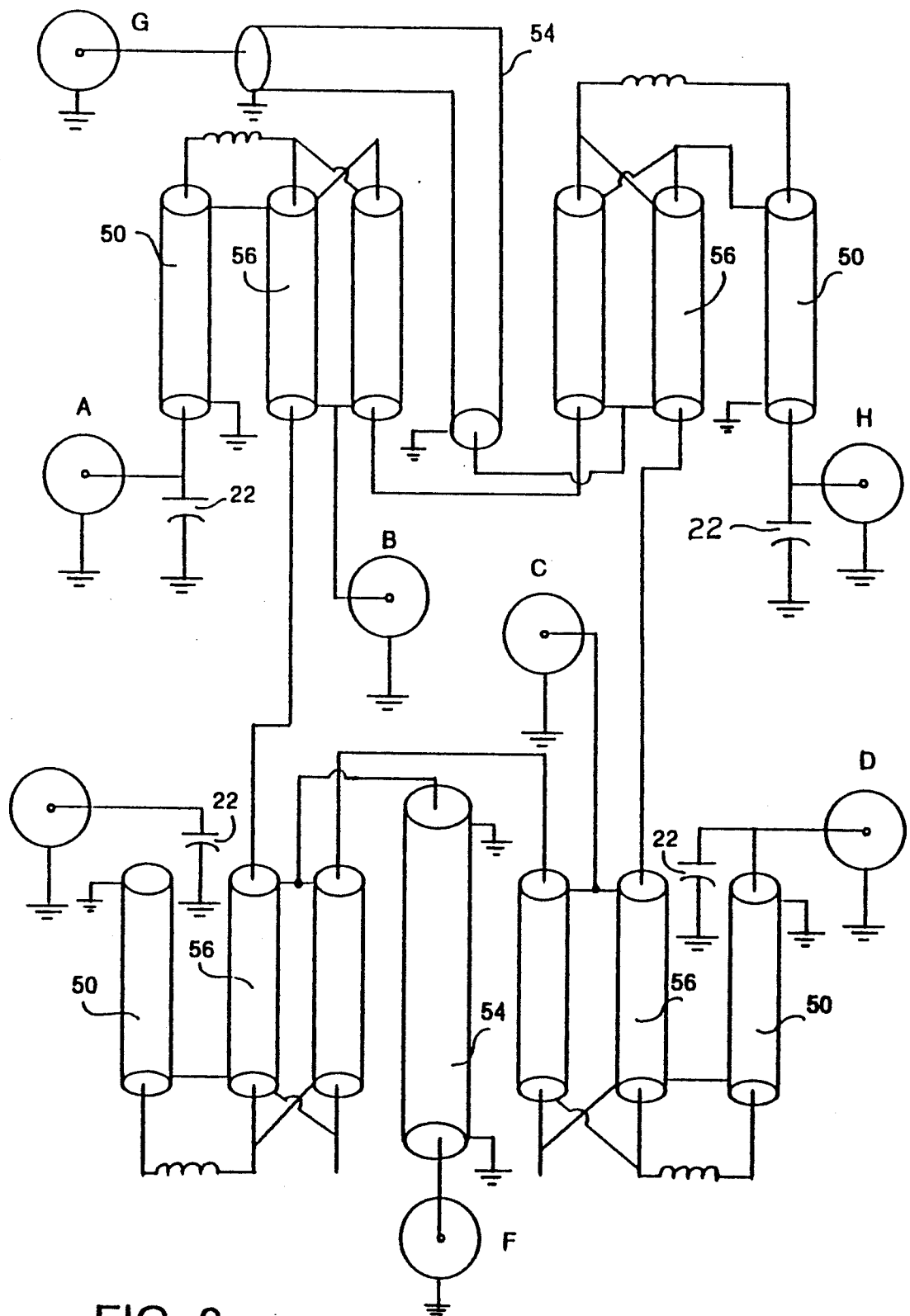
FIG. 6 is a schematic diagram of an H matrix which may be utilized with the communication system of FIG. 3.

With reference to FIG. 6, an H matrix which may be utilized with the present invention includes four input ports A, B, C, D and four output ports E, F, G, H. When the matrix is constructed as shown in the matrix of FIG. 6, the signals appearing at the input ports may be obtained at the output ports with the phase shifts shown in the following table:

|   | E | F | G | H |
|---|---|---|---|---|
| A | 0 | 180 | 0 | 180 |
| B | 0 | 180 | 180 | 0 |
| C | 0 | 0 | 180 | 180 |
| D | 0 | 0 | 0 | 0 |

The H matrix includes baluns 50, and transformers 56, which are interconnected as shown in FIG. 6. The output ports F and G are connected to the transformers 56 through sections of coaxial cable 54 which shield the output side of the matrix device at a constant impedance.

Figure 7:
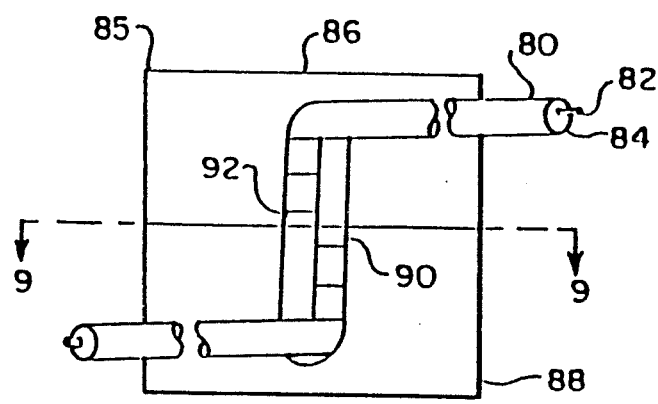
FIG. 7 is a pictorial diagram of an embodiment of a transformer in accordance with the present invention.
Figure 10:
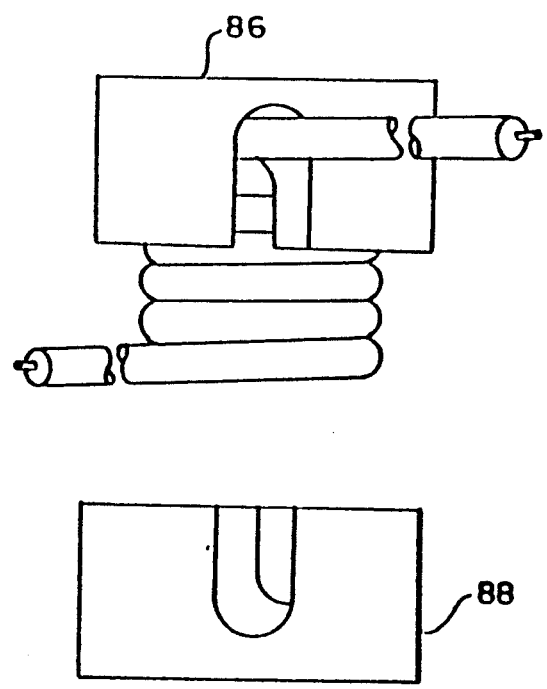
FIG. 10 is an exploded pictorial diagram of the transformer of FIG. 7.
Figure 8:
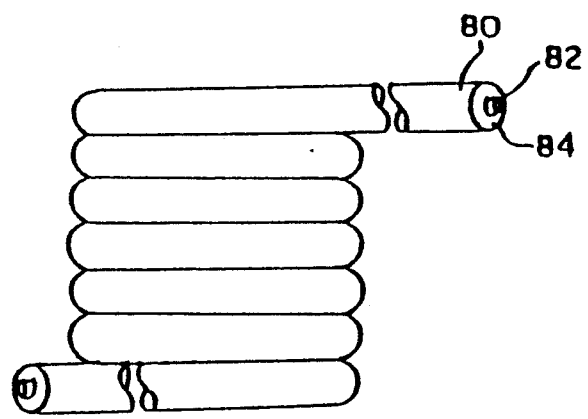
FIG. 8 is a pictorial diagram of the transmission line of the transformer of FIG. 7.
Figure 9:
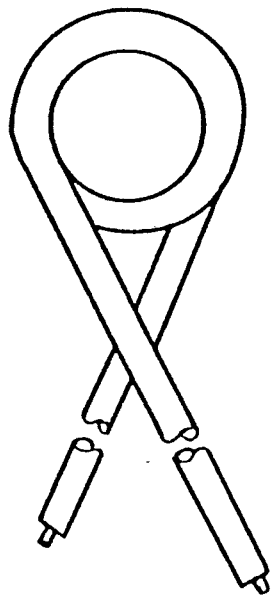
FIG. 9 is a pictorial diagram showing a top view of the transmission line of FIG. 8.

With reference to FIG. 7, a transformer in accordance with the present invention may be formed by enclosing a transmission line within a cavity formed entirely within a block of ferrite material. A transmission line may be formed by a center conductor 82 which is surrounded by an insulative dielectric material 84 and an outer conductive sheath 80. With additional reference to FIGS. 8 and 9, the transmission line may be formed in the shape of a coil of a size which will fit within a cavity within a ferrite block 85 having interfitting upper block section 86 and lower block section 88. The ends of the transmission line made available for connection to the rest of the circuit through access slots 90 and 92 in the lower and upper block sections 86, 88, respectively.

Figure 11:
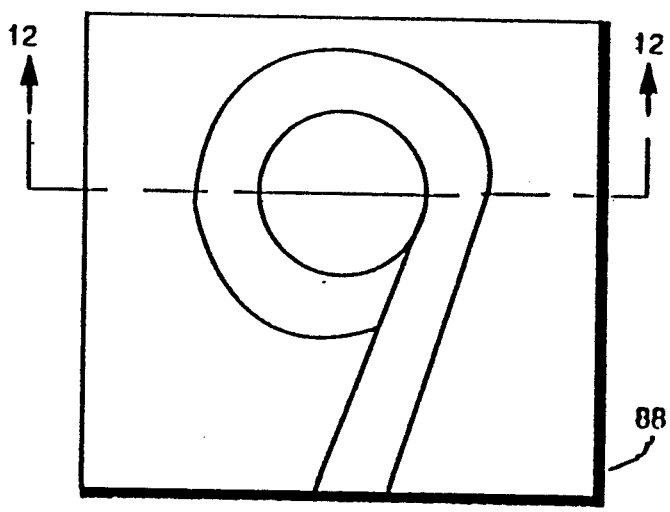
FIG. 11 is a pictorial diagram showing a top view of the bottom section of the transformer of FIG. 7.
Figure 12:
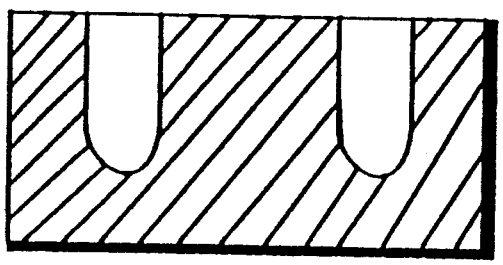
FIG. 12 is a cross section of the bottom section of FIG. 11.

With reference to FIG. 11, and continued reference to FIG. 7, it will be appreciated that the lower block section 88 may be evacuated in a path having the general shape of the numeral "9" and that the upper block section 86 will have an evacuated path of complementary shape so that, when the two block sections 86, 88 are mated, the coiled transmission line fits within the evacuated path formed therein. Thus, the coil of the transmission line, when it is inserted to fit within the evacuated space, is surrounded with ferrite material on all sides except the access slots 90, 92. The surrounding of the coil transmission line by the ferrite material reduces the amount of RF interference which is provided directly to the air by the coiled transmission line and provides an interaction between the ferrite material and the transmission line throughout almost all of its coiled length.

Figure 13:
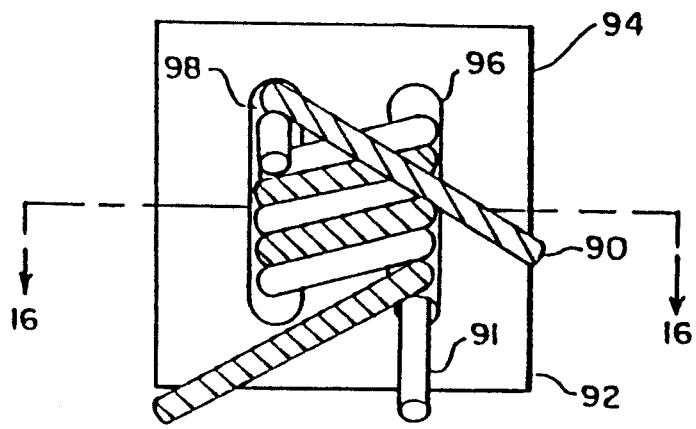
FIG. 13 is a pictorial diagram of a second embodiment of a transformer in accordance with the present invention.
Figure 14:
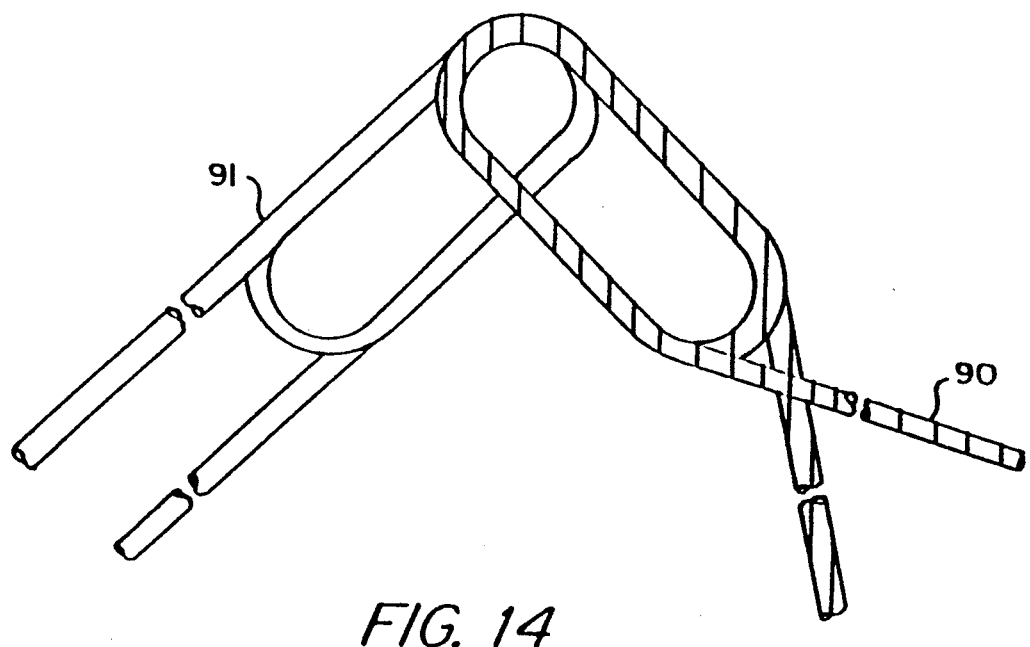
FIG. 14 is a pictorial diagram of the transmission lines of the transformer of FIG. 13 with the lines depicted in a separated position.
Figure 15:
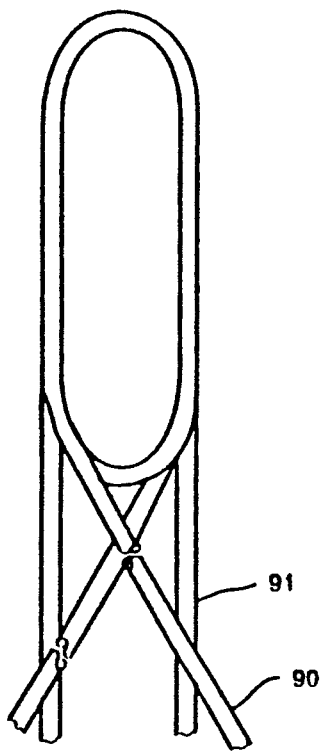
FIG. 15 is a pictorial diagram of the transmission lines of the transformer of FIG. 13 with the lines aligned.

With reference to FIG. 13, two independent coiled transmission lines may be intertwined within the evacuated space of a ferrite block to form an efficient transformer. As depicted in FIG. 14, two transmission lines 90 and 91 may be formed in the shape of two ovular coils where the two coils are intertwined so that adjacent rings of each of the intertwined coils are alternatingly a part of one or the other of the transmission lines 90, 91. The intertwined transmission lines are shown separately for clarity in FIG. 14 and aligned as used within the present invention in FIG. 15.

Figure 16:
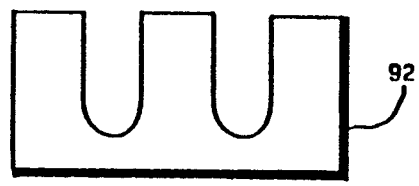
FIG. 16 is a pictorial diagram of the bottom block section of the ferrite block of the transformer of FIG. 13.
Figure 17:
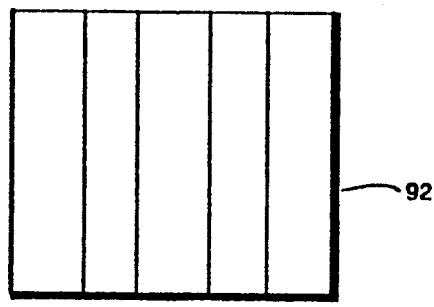
FIG. 17 is a pictorial diagram of a view of the bottom block section of FIG. 16.

With reference to FIGS. 13, 16, and 17, the intertwined transmission lines 90, 91 may be placed to surround the evacuated channels 96, 98 of the two complementary halves of a ferrite block 92, 94. The use of ovular coils permits a greater percentage of the transmission coils to be within the ferrite block. Alternatively, the ferrite block and transmission lines could be shaped as shown in FIG. 7 so that the entirety of the coiled sections of the transmission lines could be within the ferrite block.

While presently preferred embodiments of the present invention are described herein, many variations and modifications will become apparent to those skilled in the art. The foregoing description is not intended to limit the scope of the claims. Accordingly, any modifications, variations, or equivalents within the scope of the attached claims should be considered to be within the scope of the invention.

What is claimed is:

1. A wideband communications system for combining a first plurality of information signals to be transmitted by a transmitting antenna comprising:
   (a) a first plurality of exciter means for modulating each of said information signals on a separate carrier frequency;
   (b) a second plurality of wideband amplifier means, each for amplifying one to more of said modulated information signals;
   (c) distribution means for providing said modulated information signals to said wideband amplifier means,
   said distribution means comprising means for providing no more than one of said modulated information signals to each of said wideband amplifier means when the first plurality of information signals is less than or equal to the second plurality of wideband amplifier means,
   said distribution means further comprising means for providing two of said modulated information signals to at least one of said wideband amplifier means and providing only one of said modulated information signals to each of the other said wideband amplifier means when the first plurality of information signals exceeds the second plurality of wideband amplifier means; and
   (d) combining means for combining said amplified modulated information signals to form a combined signal and for providing said combined signal without filtration and further amplification to said transmitting antenna.

2. The communication system as defined in claim 1 wherein each said exciter means modulates on a ratio frequency.

3. The system as defined in claim 2 wherein said distribution means further comprises plural hybrid matrix means, each for steering phase-shifted portions of one or more of said modulated information signals to one of said amplifier means, each hybrid matrix means comprising:
  (a) plural input means, each for receiving one portion of one or more of said modulated information signals;
  (b) plural output means, each for providing one portion of one or more of said modulated information signals to one of said amplifier means; and
  (c) plural transformer means adapted for shifting the phase of each said portion so that any one said portion may be in phase or 180° out of phase with any other said portion, responsively to the selection of said input means and said output means for each said portion.

4. The system as defined in claim 3 wherein said combining means comprises one or more transformers for generating a reduced amount of radio frequency interference, each of said transformers comprising:
  (a) a transmission line forming a coil having connecting portions of said line extending therefrom; and
  (b) a block of ferrite for enclosing a substantial part of said coil,
  said coil generally surrounding the core of said block and extending through said block at said connecting portions when said coil is enclosed in said block,
  whereby said block reduces the amount of radio frequency interference generated by said line when an electric current is passed therethrough.

5. The system as defined in claim 4 wherein said block comprises two sections, and wherein each of said sections includes an evacuated path for said line that is at least partially exposed when said two sections are separated.

6. The communication system as defined in claim 2 wherein each said modulated information signal is modulated on a carrier frequency that may vary with time.

7. A radio frequency transmitting system comprising:
  (a) a plurality of radio frequency amplifiers each having amplifier input and amplifier output circuits;
  (b) combining means for combining said amplifier output circuits to a signal transmitter output circuit;
  (c) a plurality of exciter means, each having an exciter output circuit for carrying radio frequency signals; and
  (d) circuit mean for selectively connecting said exciter output circuits to said amplifier input circuits so that individual signals on said exciter output circuits are applied to said amplifier input circuits exclusive of signals on other exciter output circuits connected to other amplifier input circuits, and in combination with a signal on no more than one other said exciter output circuit when there are more said exciter means than said amplifiers.

8. In a transmitter system for transmitting plural signals on an antenna, including a plurality of amplifiers, each having input and output circuits, with all said output circuits coupled to an antenna through a common transmitter output circuit, and including a plurality of exciter means each having an exciter output circuit, a connection means for applying the signals on said exciter output circuits to said power amplifier input circuits comprising:
  (a) combining circuit means for receiving and combining signals on two exciter output circuits; and
  (b) circuit means for selectively coupling any of said exciter output circuits to any of said input circuits individually and in combination through said combining circuit means when there are more said exciter means than said amplifiers, so that each of said exciters output circuits are coupled to one of said input circuits.

9. A ratio frequency transmitter comprising:
  (a) a first plurality of radio frequency power amplifier circuits;
  (b) signal connection means adapted to receive a second plurality of separate ratio frequency signals no greater in number than twice said first plurality for selectively applying said second plurality of radio frequency signals to said first plurality of power amplifier circuits in a manner so that no more than two signals are applied to any one of said power amplifier circuits;
  (c) intermodulator reduction transformer mans for reducing intermodulation effects resulting from applying more than one radio frequency signal to one said power amplifier; and
  (d) coupling means adapted to be connected to an antenna for receiving output signals from said first plurality of power amplifier circuits and for using said transformer means to combine said output signals.

10. A wideband communication system for combining a plurality of information signals to be transmitted by a transmitting antenna comprising:
  (a) a plurality of exciter means for modulating each of said information signals on a separate carrier frequency;
  (b) a plurality of wideband amplifier means, each for amplifying one or more of said modulated information signals;
  (c) distribution means for providing said modulated information signals to said wideband amplifier means, said distribution means comprising plural hybrid matrix means, each of steering phase-shifted portions of one or more of said modulated information signals to one of said amplifier means, each hybrid matrix means comprising;
    (i) plural input means, each for receiving one portion of one or more of said modulated information signals;
    (ii) plural output means, each for providing one portion of one or more of said modulated information signals to one of said amplifier means; and
    (iii) plural transformer means adapted for shifting the phase of each said portion so that any one said portion may be in phase or 180° out of phase with any other said portion, responsively to the selection of said input means and said output means for each said portion; and
  (d) combining means for combining said amplified modulated information signals to form a combined signal and for providing said combined signal without filtration and further amplification to said transmitting antenna.

11. The system as defined in claim 10 wherein said combining means comprises one or more transformers for generating a reduced amount of radio frequency interference, each of said transformers comprising:
  (a) a transmission line forming a coil having connecting portions of said line extending therefrom; and
  (b) a block of ferrite for enclosing a substantial part of said coil, said coil generally surrounding the core of said block and extending through said block at said connecting portions when said coil is enclosed in said block, whereby said block reduces the amount of radio frequency interference generated by said line when an electric current is passed therethrough.

12. The system as defined in claim 11 wherein said block comprises two sections, and wherein each of said sections includes an evacuated path for said line that is at least partially exposed when said two sections are separated.

13. A wideband communication system for combining a first plurality of information signals to be transmitted by transmitting antenna comprising:
 (a) a first plurality of exciter means for modulating each of said information signals on a separate carrier radio frequency that may vary with time;
 (b) a second plurality of wideband amplifier means, each for amplifying one or more of said modulated information signals;
 (c) distribution means for providing said modulated information signals to said wideband amplifier means,
 said distribution means comprising means for providing no more than one of said modulated information signals to each of said wideband amplifier means when the first plurality of information signals is less than or equal to the second plurality of wideband amplifier means,
 said distribution means further comprising means for providing two of said modulated information signals to at least one of said wideband amplifier means and providing only one of said modulated information signals to each of the other said wideband amplifier means when the first plurality of information signals exceeds the second plurality of wideband amplifier means; and
 (d) combining means for combining said amplifier modulated information signals to form a combined signal and for providing said combined signal without filtration and further amplification to said transmitting antenna.

14. An amplifier circuit for a radio transmitting system having plural exciter means comprising:
 (a) a plurality of radio frequency amplifiers, each having amplifier input and amplifier output circuits;
 (b) circuit means for selectively connecting said exciter means to said amplifier input circuits so that individual signals from said exciter means are applied to said amplifier input circuits exclusive of signals from other said exciter means connected to other said amplifier input circuits, and in combination with a signal from no more than one other said exciter means when there are more said exciter means than said radio frequency amplifiers, said circuit means comprising,
 plural hybrid matrix means, each for steering phase-shifted portions of one or more said signals from said exciter means to one of said amplifier input circuits; and
 (c) combining means for combining said amplifier output circuits without filtration and further amplification to a signal transmitter output circuit.

15. A power bank amplifier for a radio transmitting system having a first plurality of exciter means comprising:
 (a) a second plurality of radio frequency power amplifiers no fewer in number than one half said first plurality of exciter means;
 (b) distribution means adapted to receive a first plurality of separate radio frequency signals from said exciter means for selectively applying said first plurality of radio frequency signals to said second plurality of power amplifiers in a manner so that no more than two said signals are applied to any one of said power amplifiers.
 (c) intermodulation reduction transformer means for reducing intermodulation effects resulting from applying more than one of said radio frequency signals to one said power amplifier; and
 (d) combining means operatively connected to an antenna without filtration and further amplification for receiving output signals from said second plurality of power amplifiers and for using said transformer means to combine said output signals.

* * * * *